United States Patent [19]
Zdebel et al.

[11] Patent Number: 5,026,663
[45] Date of Patent: Jun. 25, 1991

[54] METHOD OF FABRICATING A STRUCTURE HAVING SELF-ALIGNED DIFFUSED JUNCTIONS

[75] Inventors: Peter J. Zdebel, Mesa; Barbara Vasquez, Chandler, both of Ariz.

[73] Assignee: Motorola, Inc., Schaumburg, Ill.

[21] Appl. No.: 382,879

[22] Filed: Jul. 21, 1989

[51] Int. Cl.⁵ .......................................... H01L 21/225
[52] U.S. Cl. .................... 437/160; 437/161; 437/162; 437/156; 437/157; 437/233
[58] Field of Search ............... 437/156, 157, 158, 161, 437/162, 160, 233; 148/DIG. 31

[56] References Cited

U.S. PATENT DOCUMENTS

| | | | |
|---|---|---|---|
| 4,209,350 | 6/1980 | Ho et al. | 148/188 |
| 4,483,726 | 11/1984 | Isaac et al. | 437/162 |
| 4,507,171 | 3/1985 | Bhatia et al. | 437/162 |
| 4,569,701 | 2/1986 | Oh | 148/188 |
| 4,830,972 | 5/1989 | Hamasaki | 437/162 |
| 4,839,305 | 6/1989 | Brighton | 437/228 |

FOREIGN PATENT DOCUMENTS 0083816 7/1983 European Pat. Off. .
0201867 11/1986 European Pat. Off. ............ 437/162

OTHER PUBLICATIONS

"A Novel CMOS Structure with a Reduced Drain-Substrate Capacitance"; Sagara et al; IEEE Transactions on Electronic Devices, vol. 36, No. 3, p. 598, Mar. 1989.

Primary Examiner—Brian E. Hearn
Assistant Examiner—Trung Dang
Attorney, Agent, or Firm—Harry A. Wolin

[57] ABSTRACT

A method of fabricating a semiconductor structure having self-aligned diffused junctions is provided wherein a first dielectric layer, a doped semiconductor layer and a second dielectric layer are formed on a semiconductor substrate. An opening extending to the semiconductor substrate is then formed through these layers. Undoped semiconductor spacers are formed in the opening adjacent to the exposed ends of the doped semiconductor layer and dopant is diffused from the doped semiconductor layer through the undoped semiconductor spacers and into the semiconductor substrate to form junctions therein. This provides for integrated contacts through the doped semiconductor layer.

8 Claims, 4 Drawing Sheets

METHOD OF FABRICATING A STRUCTURE HAVING SELF-ALIGNED DIFFUSED JUNCTIONS

BACKGROUND OF THE INVENTION

This invention relates, in general, to semiconductor structures, and more particularly to a method of fabricating a semiconductor structure having self-aligned diffused junctions.

In an article entitled "A Novel CMOS Structure With a Reduced Drain-Substrate Capacitance", IEEE Transactions on Electron Devices, Vol. 36, No. 3, page 598, March 1989, Sagara et al. describe a CMOS structure and method of fabrication. To fabricate the structure, junctions are formed by the lateral diffusion of impurities from imbedded doped polysilicon films into mesas of the silicon substrate. The method employs no spacer technology. This method has relatively limited scalability because the total junction area is defined by a photolithographic etch and diffusion which require that lithographic parameters be maintained.

U.S. Pat. No. 4,569,701 entitled "Technique for Doping from a Polysilicon Transfer Layer" issued to Oh on Feb. 11, 1986 teaches that it is necessary to controllably dope trench sidewalls for trench isolation technology or trench capacitor type memory cells. The technique disclosed includes depositing a transfer layer of polysilicon to conformally coat the trench bottom, sidewalls and the top surface surrounding the trench An impurity is implanted into the polysilicon at the bottom of the trench and around the top surface. The impurity is diffused throughout the sidewalls by heating and may then be diffused into the substrate.

U.S. Pat. No. 4,209,350, entitled "Method for Forming Diffusions Having Narrow Dimensions Utilizing Reactive Ion Etching" issued to Ho et al. on June 24, 1980, is also related to the present invention. Diffusions having submicrometer dimensions are formed in a silicon body by forming insulator regions having substantially horizontal and vertical surfaces and then forming a layer having a desired dopant concentration thereon. The layer is then reactive ion etched to remove only the horizontally disposed portions of the layer. The dopant is then diffused into the silicon body by heating.

Accordingly, it would be highly desirable to fabricate a structure having self-aligned diffused junctions that are highly scaleable, not defined by photolithographic parameters and includes integrated contacts through a horizontal semiconductor layer.

SUMMARY OF THE INVENTION

Accordingly, it is an object of the present invention to provide a method of fabricating a semiconductor structure having self-aligned diffused junctions that allows for semiconductor devices having increased speed.

Another object of this invention is to provide a method of fabricating a semiconductor structure having self-aligned diffused junctions wherein the junction area may be precisely controlled.

It is an additional object of the present invention to provide a method of fabricating a semiconductor structure having self-aligned diffused junctions that allow for increased scalability and sub-micrometer dimensions.

An even further object of the present invention is to provide a method of fabricating a semiconductor structure having self-aligned diffused junctions including integrated contacts through a horizontal semiconductor layer.

Yet a further object of the present invention is to provide a method of fabricating a semiconductor structure having self-aligned diffused junctions that does not require an etch of polysilicon over monosilicon in active device regions.

The foregoing and other objects and advantages are achieved in the present invention by one embodiment in which, as a part thereof, includes providing a semiconductor substrate and forming a first dielectric layer thereon. A doped semiconductor layer is formed on the first dielectric layer and a second dielectric layer is formed on the doped semiconductor layer. A non-photolithographically defined device opening extending to the semiconductor substrate is then etched and undoped semiconductor spacers are formed in the device opening adjacent to the exposed ends of the doped semiconductor layer. Dopant is then diffused from the doped semiconductor layer through the undoped semiconductor spacers to form junctions in the semiconductor substrate. This method of forming junctions provides integrated contacts through the doped horizontal semiconductor layer.

A more complete understanding of the present invention can be attained by considering the following detailed description in conjunction with the accompanying drawings

DETAILED DESCRIPTION OF THE INVENTION

Figure 1:
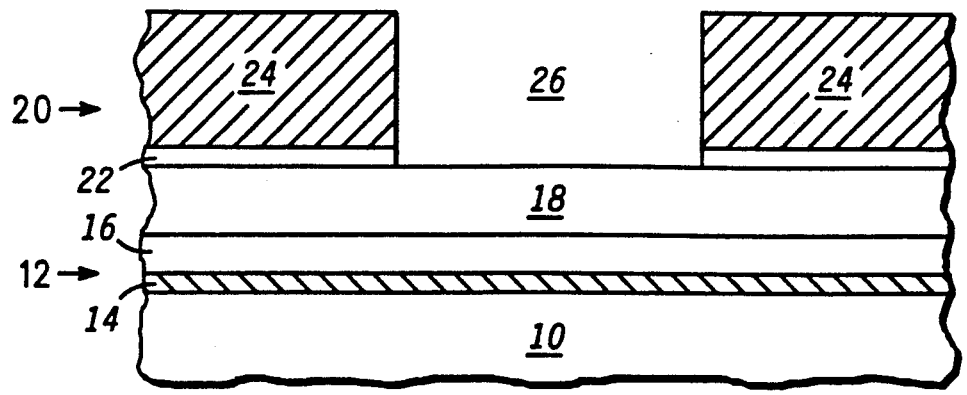
FIGS. 1-16 illustrate highly enlarged cross-sectional views of a portion of a semiconductor structure embodying the present invention during various stages of processing.
Figure 2:
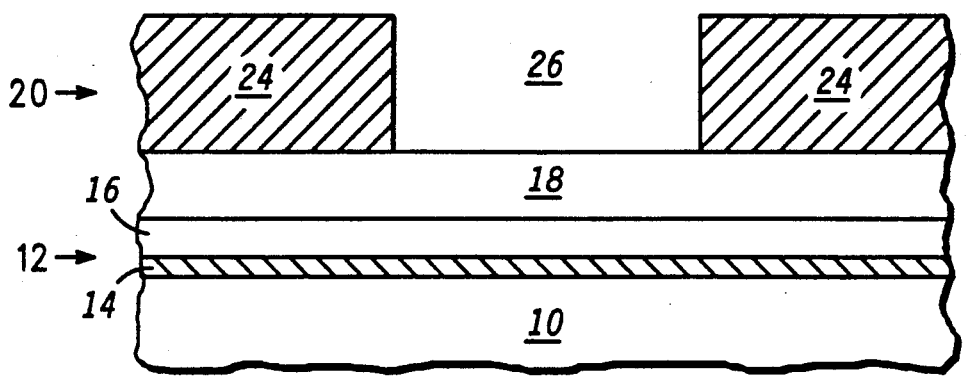

FIGS. 1-16 illustrate highly enlarged cross-sectional views of a portion of a semiconductor structure during various stages of processing. In FIG. 1, a semiconductor substrate 10 is provided. In this embodiment, semiconductor substrate 10 comprises monocrystalline silicon and may include a buried layer (not shown) therein. A first dielectric layer 12 is then formed on semiconductor substrate 10. First dielectric layer 12 includes a first oxide layer 14 which is formed by the thermal oxidation of monocrystalline silicon substrate 10 and a first nitride layer 16 which is formed on first oxide layer 14. First nitride layer 16 is formed by CVD in this embodiment. A polysilicon layer 18 is formed on first nitride layer 16. Polysilicon layer 18 is formed by CVD and is undoped at its formation in this embodiment although polysilicon layer 18 may be doped during formation by methods well known in the art. However, in this embodiment, polysilicon layer 18 is doped after its formation by methods well known in the art. After the formation of polysilicon layer 18, a second dielectric layer 20 is formed thereon. Second dielectric layer 20 may be comprised of second nitride layer 22 and second oxide layer 24 as shown in FIG. 1 or only of second oxide layer 24 as shown in FIG. 2. Second nitride layer 22 and second oxide layer 24 are both formed by methods well known in the art. Following the formation of second dielectric layer 20, a mask (not shown) is formed on second oxide layer 24 and reactive ion etching is used to form a device opening 26 through second dielectric layer 20 that extends to doped polysilicon layer 18.

Figure 3:
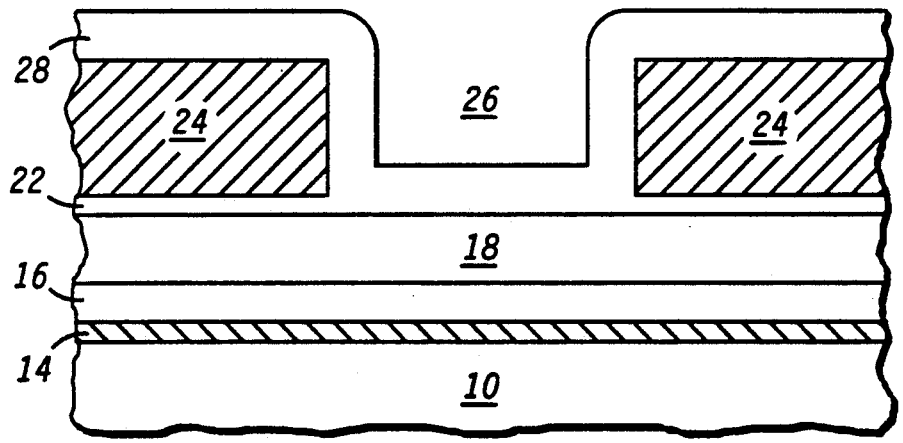
Figure 4:
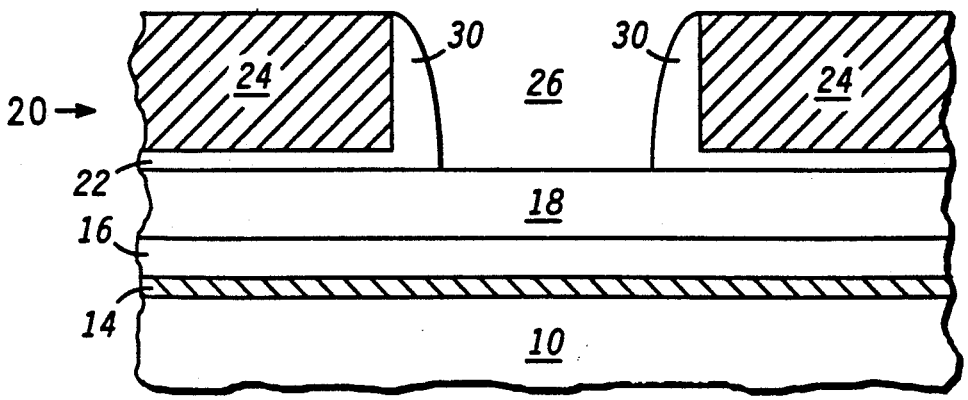
Figure 5:
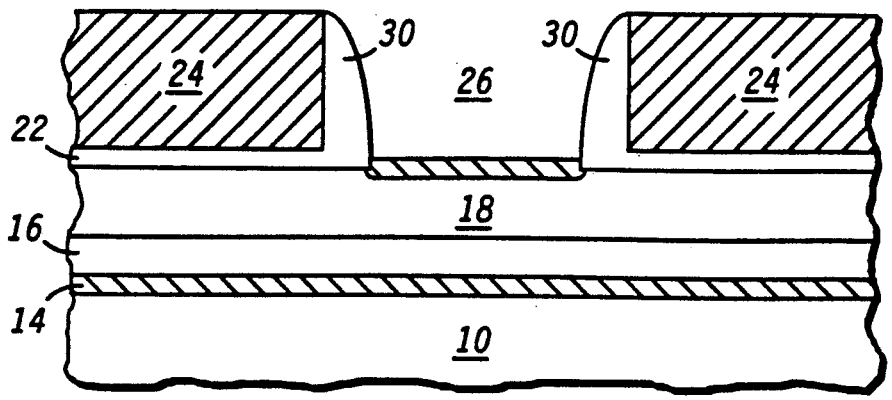
Figure 6:
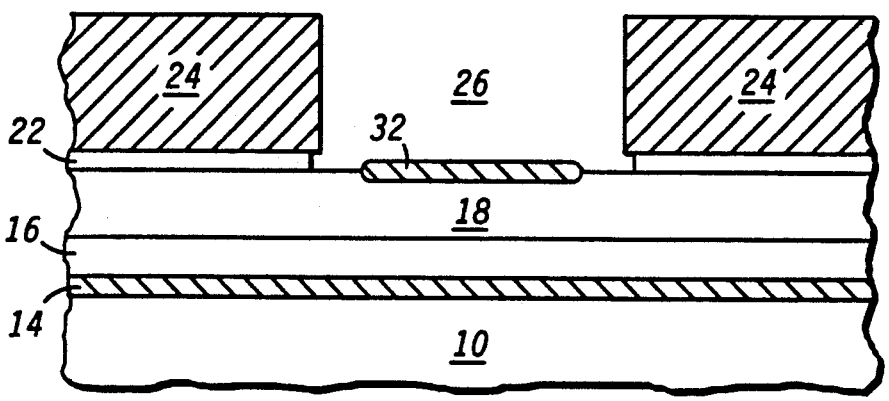

FIG. 3 depicts the formation of a conformal nitride layer 28 on the semiconductor structure. Conformal nitride layer 28 may be formed by CVD, PECVD or one of many other nitride formation methods well known in the art. As shown, conformal nitride layer 28 is disposed along the sidewalls and bottom of device opening 26. FIG. 4 shows the formation of nitride spacers 30 from conformal nitride layer 28. Essentially, conformal nitride layer 28 is completely removed excepting nitride spacers 30 which are formed along the sidewalls of device opening 26. Nitride spacers 30 are formed by the reactive ion etching of conformal nitride layer 28. Further, nitride spacers 30 are variable in that they may be deposited to different thicknesses depending upon the intended applications. In FIG. 5, an oxide lens 32 is formed in device opening between nitride spacers 30. Oxide lens 32 is formed by the thermal oxidation of doped polysilicon layer 18 between nitride spacers 30. Depending upon the application for which the structure will be used, oxide lens 32 may be formed to different thicknesses. Following the formation of oxide lens 32 in device opening 26, nitride spacers 30 are removed as shown in FIG. 6 to leave portions of doped polysilicon layer 18 exposed. Nitride spacers 30 are removed in this embodiment by a wet etch employing an etchant of hot phosphoric and sulfuric acids that has excellent nitride/oxide selectivity.

Figure 7:
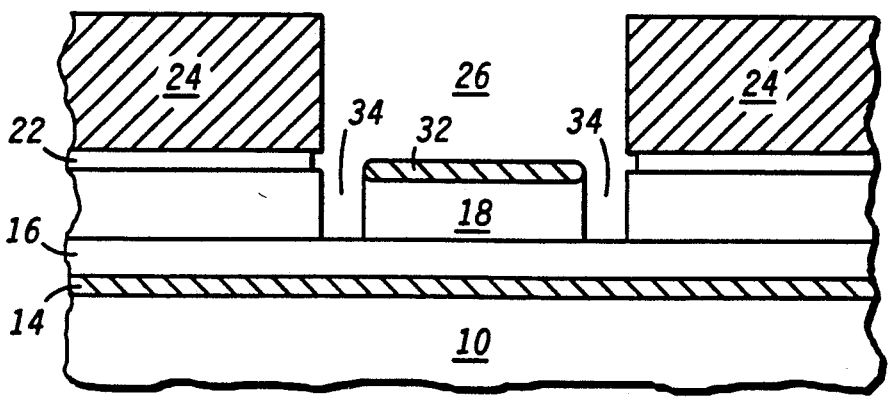
Figure 8:
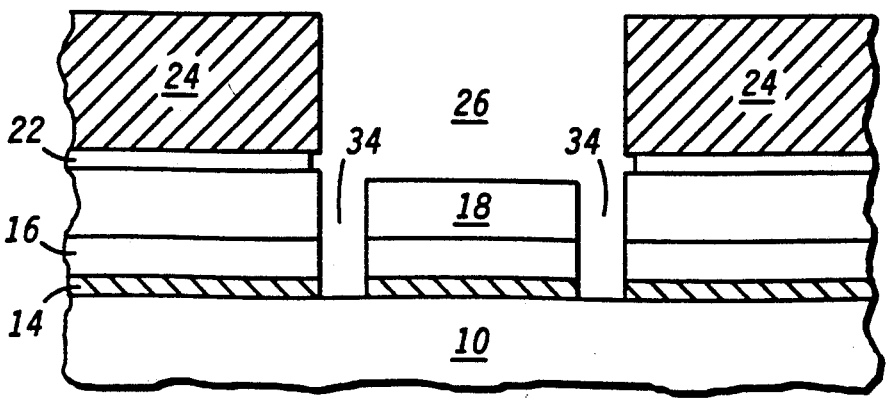
Figure 9:
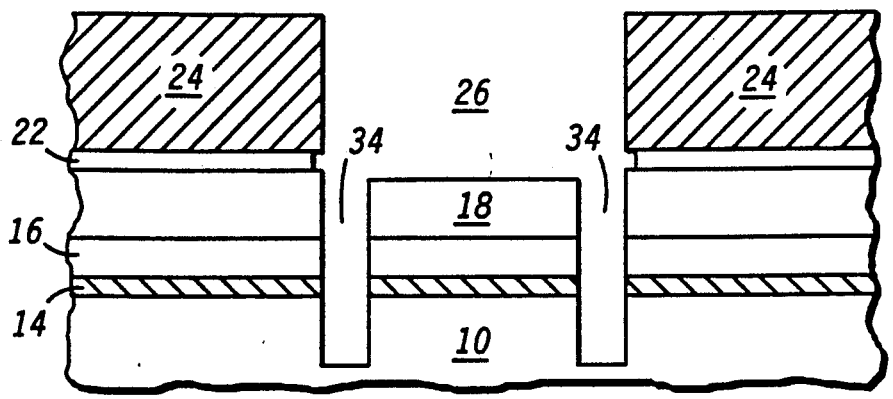

FIG. 7 depicts the formation of openings 34 in device opening 26 at the regions where nitride spacers 30 were formerly disposed. In this embodiment, openings 34 are formed using a multiple part etch. Initially, openings 34 are etched through doped polysilicon layer 18 by anisotropic reactive ion etching. It can be seen that this part of the etch also reduces the thickness of oxide lens 32. In FIG. 8, openings 34 are etched through first nitride layer 16 and first oxide layer 14 to semiconductor substrate 10. Anisotropic reactive ion etching is also employed here. This etch is also designed to remove oxide lens 32 from doped polysilicon layer 18 in device opening 26. Depending upon the application for which this structure will be employed, openings 34 may further be etched into semiconductor substrate 10 as shown in FIG. 9. An isotropic silicon etch may also be employed at this point.

Figure 10:
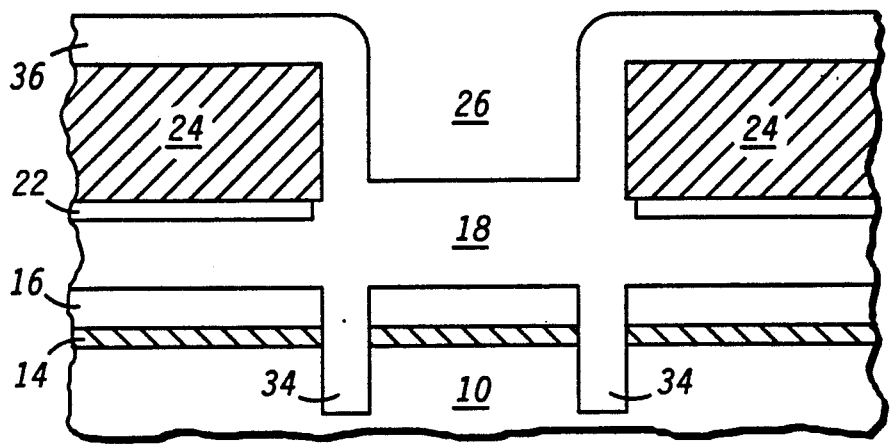
Figure 11:
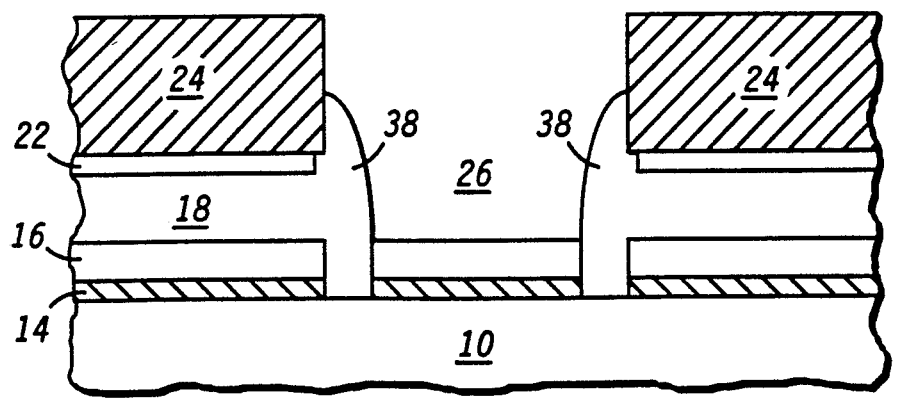

In FIG. 10, a conformal polysilicon layer 36 is formed on the structure. Conformal polysilicon layer 36 is formed on second oxide layer 24 as well as in device opening 26 and openings 34. Conformal polysilicon layer 36 is undoped and in this embodiment, is formed by LPCVD. FIG. 11 depicts the formation of polysilicon spacers 38 from conformal polysilicon layer 36. It should be understood that conformal polysilicon layer 36 is completely removed except for polysilicon spacers 38. The anisotropic reactive ion etch used to form polysilicon spacers 38 also removes the portion of doped polysilicon layer 18 which was disposed in device opening 26.

Figure 12:
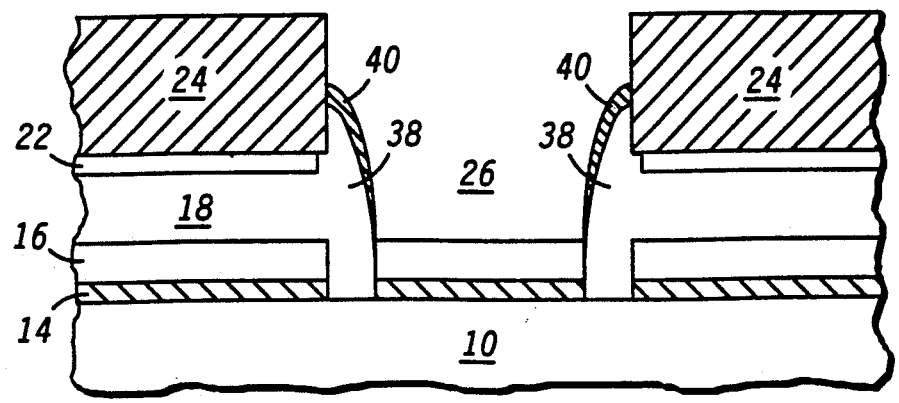
Figure 13:
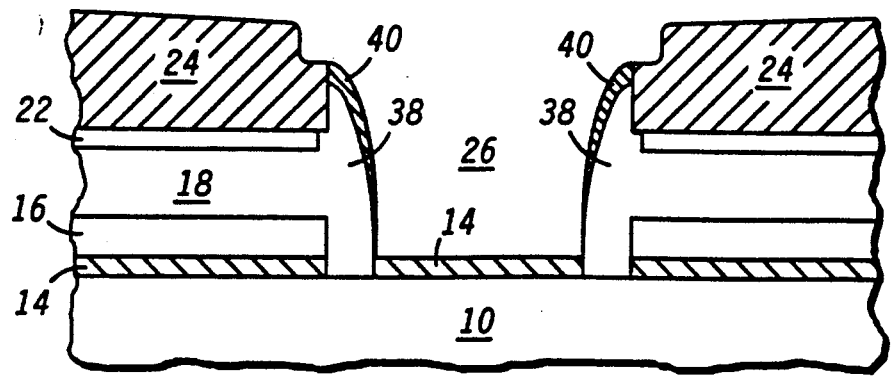

In another embodiment depicted by FIGS. 12 and 13, a screen oxide layer 40 is formed on polysilicon spacers 38. In this embodiment, screen oxide layer 40 is formed by thermally oxidizing polysilicon spacers 38 although it could be formed by other methods well known in the art. Once screen oxide layer 40 has been formed on polysilicon spacers 38, the portion of first nitride layer 16 disposed in device opening 26 is removed. This is done by a wet etch employing an etchant of hot phosphoric and sulfuric acid that insures good selectivity to the underlying first oxide layer 14.

Figure 14:
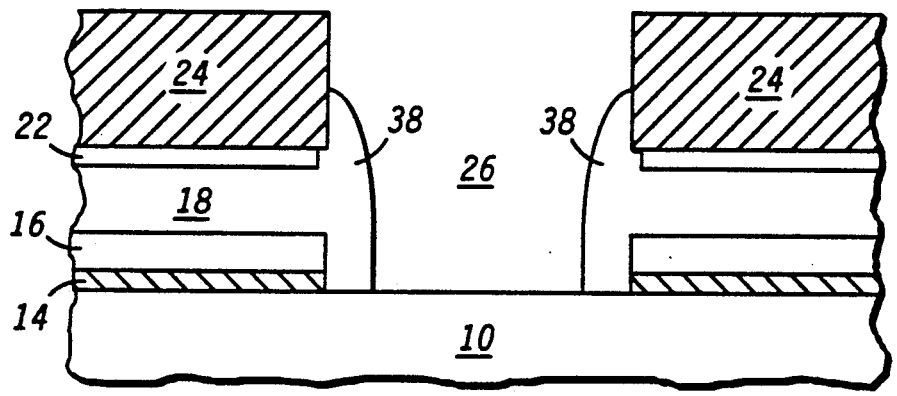
Figure 15:
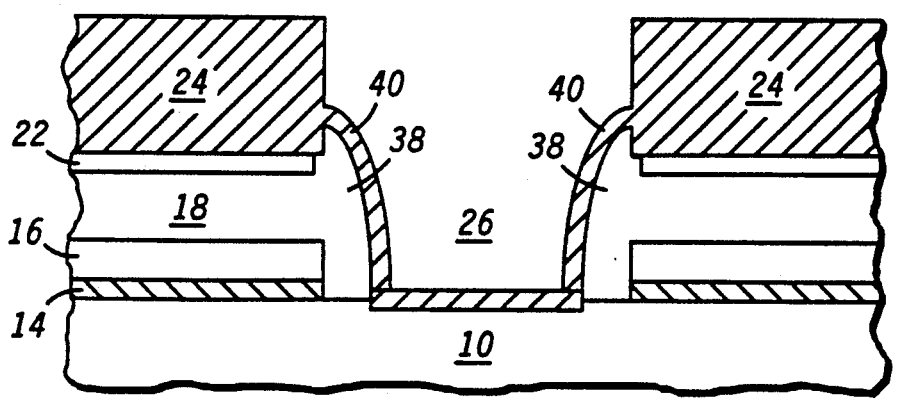

Another embodiment of forming a screen oxide layer is depicted by FIGS. 14 and 15. In FIG. 14, the portions of first nitride layer 16 and first oxide layer 14 that are disposed in device opening 26 are removed thereby exposing semiconductor substrate 10. Again, first nitride layer 16 is removed by a wet etch employing an etchant of hot phosphoric and sulfuric acids and first oxide layer 14 is removed by low bias reactive ion etching. In FIG. 15, screen oxide layer 40 is formed by thermally oxidizing polysilicon spacers 38 and semiconductor substrate 10 in device opening 26 between polysilicon spacers 38. It should be understood that the choice of oxidation conditions depends in part in what differential oxidation of polysilicon versus monosilicon is desired and the effectiveness of the monosilicon oxide as a sacrificial oxide for certain device applications.

The formation and patterning of masks on screen oxide layer 40 for the implantation of dopants into semiconductor substrate 10 may now be employed depending upon the application for which the structure will be used. One skilled in the art will understand that the species, dose and energy will be application specific.

Figure 16:
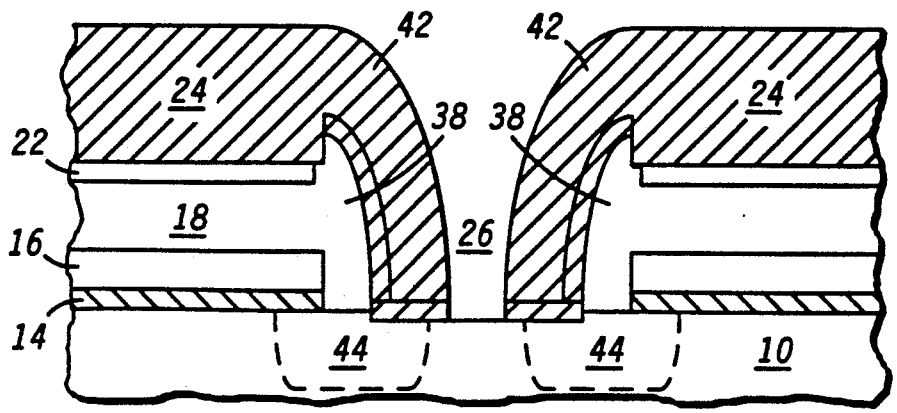

FIG. 16 depicts the formation of dielectric spacers 42. In this embodiment, dielectric spacers 42 are comprised of oxide and are formed by CVD although other dielectric materials such as CVD nitride may be employed. It should be understood that dielectric spacers 42 should be formed of a thickness required to result in a spacer width tailored to a specific device application. Dielectric spacers 42 serve to limit the finished emitter width if the structure is to be used for a bipolar device or the finished gate length if the structure is to be used for an MOS device. This procedure is very useful in achieving deep, well controlled submicrometer device dimensions below those that can be obtained by employing state of the art photolithography techniques. Also shown in FIG. 16 are junctions 44. Junctions 44 are formed by diffusing dopant from doped polysilicon layer 18 through originally undoped polysilicon spacers 38 and into semiconductor substrates 10. Of course, polysilicon spacers 38 will become doped once dopant is diffused therethrough into semiconductor substrate 10 thereby establishing electrical connection between polysilicon layer 18 and substrate 10. One of skill in the art will understand that integrated contacts are automatically created to junctions 44 through polysilicon spacers 38 and polysilicon layer 18.

It should be understood that the method disclosed herein will enable one of skill in the art to fabricate a wide spectrum of devices. This method may be used for bipolar devices as well as MOS devices with elevated electrodes and will allow for the fabrication of BICMOS circuits that employ only one basic semiconductor structure.

Thus it is apparent that there has been provided, in accordance with the invention, a method of fabricating a semiconductor structure having self-aligned diffused junction which meets the objects and advantages set forth above. While specific embodiments of the present invention have been shown and described, further modifications will occur to those skilled in the art. It is desired that it be understood, therefore, that this invention is not limited to the particular form shown and it is intended in the appended claims to cover all modifications which do not depart from the spirit and scope of this invention.

We claim:

1. A method of fabricating a semiconductor structure having self-aligned diffused junctions comprising the steps of:
   providing a semiconductor substrate;
   forming a first dielectric layer on said substrate;
   forming a doped semiconductor layer on said first dielectric layer;
   forming a second dielectric layer on said doped semiconductor layer;
   forming an opening through said second dielectric layer;
   forming dielectric spacers in said opening;
   forming a dielectric lens in said opening between said dielectric spacers;
   removing said dielectric spacers;
   forming openings through said doped semiconductor layer and said first dielectric layer at the regions where said dielectric spacers were formerly disposed;
   forming undoped semiconductor material in said openings formed where said dielectric spacers were formerly disposed;
   removing said doped semiconductor layer and said first dielectric layer from between said undoped semiconductor material; and
   diffusing dopant from said doped semiconductor layer through said undoped semiconductor material and into said substrate to form junctions in said substrate.

2. The method of claim 1 wherein the openings formed where the dielectric spacers were formerly disposed extend into the semiconductor substrate.

3. The method of claim 2 further including the step of forming dielectric spacers in the opening, said dielectric spacers serving to limit the finished emitter width in a bipolar device or the finished gate length in an MOS device.

4. A method of fabricating a semiconductor structure having self-aligned diffused junctions comprising the steps of:
   providing a monosilicon substrate;
   forming a first oxide layer on said substrate;
   forming a first nitride layer on said oxide layer;
   forming a polysilicon layer on said nitride layer;
   doping said polysilicon layer either during or after its formation;
   forming a second oxide layer on said polysilicon layer;
   forming a mask on said second oxide layer to define a device opening;
   forming said device opening by etching through said second oxide layer and stopping on said polysilicon layer;
   forming a conformal nitride layer over said semiconductor structure;
   etching said conformal nitride layer to form nitride spacers in said device opening;
   thermally oxidizing said polysilicon layer between said nitride spacers in said device opening to form an oxide lens;
   removing said nitride spacers from said device opening;
   forming openings in said device opening at the regions where said nitride spacers were formerly disposed, said openings extending to said substrate;
   forming a conformal polysilicon layer over the device structure including in said openings;
   etching said conformal polysilicon layer to form polysilicon spacers;
   removing the remainder of said polysilicon layer, said first nitride layer and said first oxide layer from between said polysilicon spacers in said device opening; and
   diffusing dopant from said polysilicon layer, through said polysilicon spacers and into said substrate to form junctions therein.

5. The method of claim 4 further comprising the step of forming a second nitride layer on the polysilicon layer prior to the formation of the second oxide layer.

6. The method of claim 4 wherein the forming openings step includes said openings extending into the substrate.

7. The method of claim 4 wherein the forming openings step comprises the steps of:
   etching through the polysilicon layer;
   etching through the first nitride layer and the first oxide layer; and
   etching into the substrate if it is desired that said openings extend into said substrate.

8. The method of claim 4 further including the steps of:
   forming a screen oxide layer on the polysilicon spacers and on the substrate in the device opening;
   forming and patterning masks on said screen oxide layer;
   implanting dopants into said substrate; and
   forming oxide or nitride spacers in said device opening, said oxide or nitride spacers serving to limit the finished emitter width in a bipolar device or the finished gate length in an MOS device.

* * * * *